United States Patent
Sisson et al.

(10) Patent No.: US 9,991,929 B1
(45) Date of Patent: Jun. 5, 2018

(54) STREAMING COMPRESSION OF PERIODIC BINARY AVIONIC DATA

(71) Applicant: Rockwell Collins, Inc., Cedar Rapids, IA (US)

(72) Inventors: James E. Sisson, Palo, IA (US); Nicholas J. Helsper, Anamosa, IA (US); Luis C. Martinez, Cedar Rapids, IA (US); Douglas M. McVicar, Ely, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 0 days. days.

(21) Appl. No.: 15/612,915

(22) Filed: Jun. 2, 2017

(51) Int. Cl.
| | |
|---|---|
| *G06F 11/00* | (2006.01) |
| *H04B 1/66* | (2006.01) |
| *H03M 5/14* | (2006.01) |
| *H04B 7/185* | (2006.01) |

(52) U.S. Cl.
CPC ............. *H04B 1/66* (2013.01); *H03M 5/145* (2013.01); *H04B 7/18506* (2013.01)

(58) Field of Classification Search
CPC ...... H04B 1/66; H04B 7/18506; H03M 5/145
See application file for complete search history.

(56) References Cited

U.S. PATENT DOCUMENTS

| | | | |
|---|---|---|---|
| 2002/0057902 A1* | 5/2002 | Song ................... | G11B 15/1875 386/356 |
| 2005/0100229 A1* | 5/2005 | Becker ................ | H04N 19/176 382/232 |
| 2013/0057646 A1* | 3/2013 | Chen ................... | H04N 19/597 348/43 |

* cited by examiner

*Primary Examiner* — Dac Ha
(74) *Attorney, Agent, or Firm* — Donna P. Suchy; Daniel M. Barbieri

(57) ABSTRACT

Embodiments of the inventive concepts disclosed herein are directed to a system, apparatus, and method for streaming compression of periodic binary data. A data transmitter of an aircraft can receive flight data from a flight data acquisition unit. The data transmitter can store the flight data. The data transmitter can compare words corresponding to a first data frame to words corresponding to a second data frame. The data transmitter can identify a word block of consecutive unchanged words, consecutive changed words, or one changed word and one unchanged word. The data transmitter can generate and transmit a header identifying a number of consecutive unchanged words in a word block. The data transmitter can generate a header identifying a number of consecutive changed words in a word block and transmit the header and the word block. The data transmitter can generate a header identifying two words in a word block and transmit the header and the word block.

20 Claims, 6 Drawing Sheets

STREAMING COMPRESSION OF PERIODIC BINARY AVIONIC DATA

BACKGROUND

The inventive concepts disclosed herein relate generally to the field of avionics data collection and/or transmission.

A flight data acquisition unit of an aircraft periodically collects avionics data (e.g., flight data recorder (FDR) data) during a flight. The collected data can relate to altitude, velocity, fuel level, time, location, electro-mechanical (e.g. engine) operation, and other parameters. The collected data is generally converted to a standardized data stream, such as the ARINC (Aeronautical Radio, Incorporated) 717 Protocol and stored in a flight data recorder.

An airborne aircraft can wirelessly transmit collected data to a ground station or receiver using a radio communications link, such as Very High Frequency (VHF) or SATCOM radio. Over the course of an entire flight, a large amount of data can be accumulated and/or wirelessly transmitted. However, aircraft data networks are designed to handle periodic data transmission, and it can be expensive to transmit large data streams. Also, it is often impractical to store large amounts of data collected over a long period of time in a flight data recorder.

SUMMARY

In one aspect, embodiments of the inventive concepts disclosed herein are directed to a method of streaming compression of periodic binary data. A data transmitter of an aircraft can receive flight data from a flight data acquisition unit. The data transmitter can store the flight data. The data transmitter can compare words corresponding to a first data frame to words corresponding to a second data frame. The data transmitter can identify a word block of consecutive unchanged words, a word block of consecutive changed words, or a word block of one changed word followed by one unchanged word. The data transmitter can generate and transmit an 8-bit skip header identifying a number of consecutive unchanged words in a word block. The data transmitter can generate an 8-bit read header identifying a number of consecutive changed words in a word block and transmit the header and the word block. The data transmitter can generate an 8-bit read header identifying a word block with one changed word followed by one unchanged word and transmit the header and the word block. Each word block may be at least two words and a maximum size of each word block may be 254 words.

In a further aspect, embodiments of the inventive concepts disclosed herein are directed to a data transmitter that can include a communications interface configured to receive flight data containing one or more words from a flight data acquisition unit. The data transmitter can include a data storage device configured to store received flight data in a memory. The data transmitter can include a compression processor configured to compare a set of words corresponding to a first data frame to a set of words corresponding to a second data frame. The compression processor can identify a word block of consecutive unchanged words, a word block of consecutive changed words, or a word block containing one changed word followed by one unchanged word. The compression processor can generate an 8-bit skip header identifying a number of words in the word block of consecutive unchanged words when a word block of consecutive unchanged words is identified, and transmit the 8-bit skip header. The compression processor can generate an 8-bit read header identifying a number of words in the word block of consecutive changed words when a word block of consecutive changed words is identified, and transmit the 8-bit read header and the word block. The compression processor can generate an 8-bit read header identifying a number of words in the word block when a word block contains one changed word followed by one unchanged word, and transmit the 8-bit read header and the word block. Each word block may be at least 2 words and a maximum size of each word block may be 254 words.

In a further aspect, embodiments of the inventive concepts disclosed herein are directed to a flight data recorder that can include a communications interface configured to receive flight data containing one or more words from a flight data acquisition unit. The flight data recorder can include a data storage device configured to store received flight data in a memory. The flight data recorder can include a compression processor configured to compare a set of words corresponding to a first data frame to a set of words corresponding to a second data frame, wherein the second data frame corresponds to a data frame previously received. The flight data recorder can identify a word block of consecutive unchanged words, a word block of consecutive changed words, or a word block containing one changed word followed by one unchanged word. The flight data recorder can generate an 8-bit skip header identifying a number of words in the word block of consecutive unchanged words when a word block of consecutive unchanged words is identified, and transmit the 8-bit skip header. The flight data recorder can generate an 8-bit read header identifying a number of words in the word block of consecutive changed words when a word block of consecutive changed words is identified, and transmit the 8-bit read header and the word block. The flight data recorder can generate an 8-bit read header identifying a number of words in the word block when a word block contains one changed word followed by one unchanged word, and transmit the 8-bit read header and the word block. Each word block may be at least 2 words and a maximum size of each word block may be 254 words.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
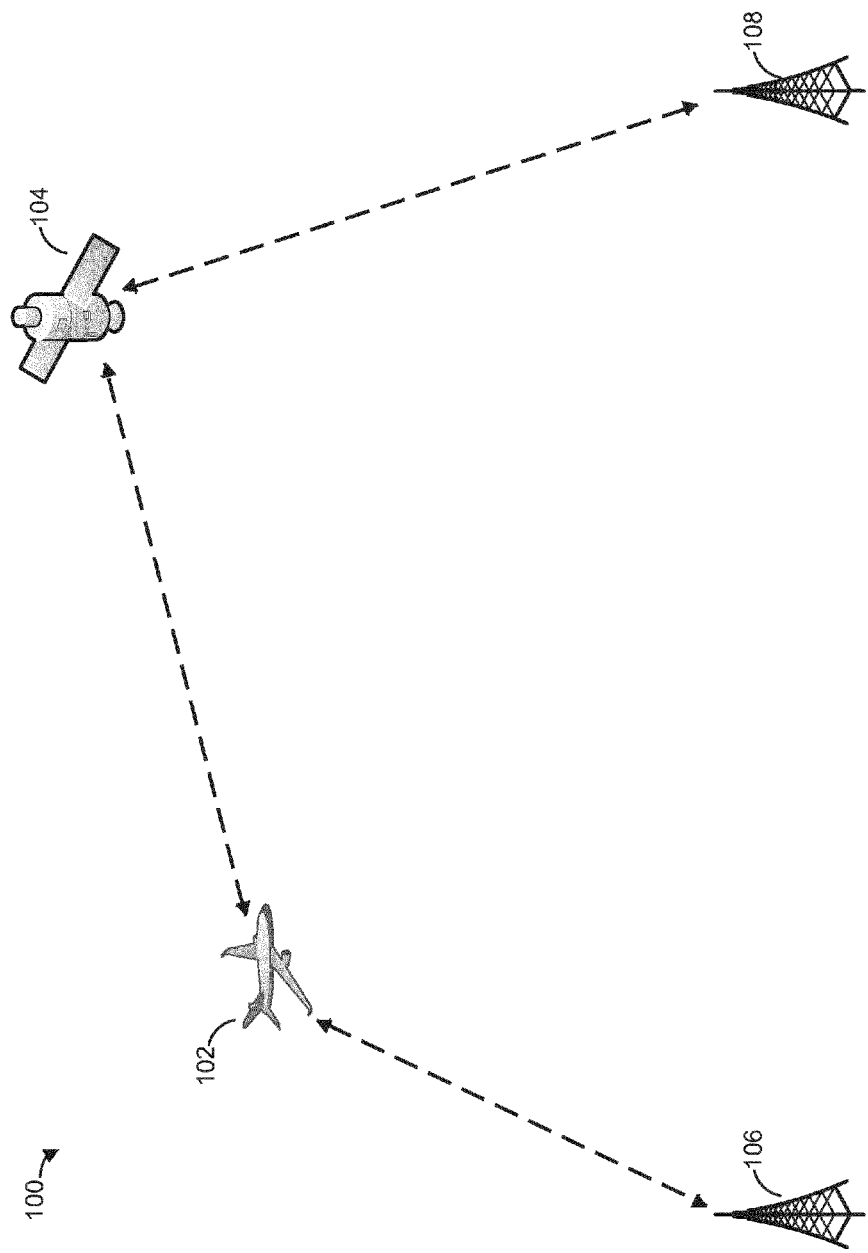
FIG. 1 shows a diagram illustrating an example embodiment of a system for streaming compression of periodic binary avionic data, according to inventive concepts in this disclosure.

Before describing in detail embodiments of the inventive concepts disclosed herein, it should be observed that the inventive concepts disclosed herein include, but are not limited, to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the schematic diagrams, but should be construed in accordance with the language in the claims.

In some aspects, embodiments of the inventive concepts disclosed herein are directed to a system, apparatus, and method of compressing avionics data collected from a flight data acquisition unit (FDAU) of an airborne aircraft. A FDAU generally collects digital and analog data relating to various parameters of the aircraft. Collected data can relate to altitude, velocity, fuel level, time, location, electro-mechanical (e.g. engine) operation, and other parameters. The data are transmitted to and stored by a flight data recorder (FDR), which is sometimes referred to as a "black box."

Prior to transmitting to the FDR for storage, the FDAU can convert the collected data to a standardized digital format, such as the ARINC (Aeronautical Radio, Incorporated) 717 Protocol. ARINC 717 is the standard most commonly used for communication between an aircraft FDAU and an FDR. ARINC 717 data consists of 12-bit words, in which all 12 bits are data bits. A word does not contain a label or any other type of identifier. Rather, each word is identified by its position within a subframe. A subframe typically contains 1024 words, although some may contain 2048, 512, or 256 words. Each subframe contains a sync word as its first word in the subframe and a frame counter as its last word in the subframe. The sync word is a 12-bit word that contains a data pattern unique to that subframe. The frame counter is the last word of each subframe and is incremented each time a frame has been transmitted.

Words within a frame are transmitted at a rate that causes each subframe to be evenly transmitted over a period of 1 second. There are 4 subframes within an ARINC 717 frame, and a frame is transmitted over a period of 4 seconds. Reception of data requires some buffering and analysis to ensure the sync words have been properly identified.

While the ARINC 717 specification provides benefits for management of avionics data, aircraft communication networks are designed to handle periodic data transmission. Transmission and storage of large data streams can be expensive and impractical. Thus, for example, avionics data collected by a FDAU (such as location information) can only be accessed by first accessing the FDR. In the event of an airplane crash, by the time the FDR is located, if at all, it can be too late to use the recovered data to save human life.

As described below in greater detail, embodiments of the present disclosure describe an apparatus and method directed to lossless compression with low latency of streaming avionics data. Embodiments can thereby significantly enhance transmission possibilities and reduce storage requirements. For example, a full set of FDAU data can be wirelessly transmitted at a reasonable cost. Furthermore, embodiments can allow avionics data to be wirelessly communicated within seconds of being collected by the FDAU, which can significantly improve flight safety and access to critical avionics data.

Referring to FIG. 1, one embodiment of a system 100 capable of streaming compression of periodic binary avionic data is shown. The system 100 is shown to include an aircraft 102, a satellite 104, and ground stations 106-108. The aircraft 102, satellite 104, and ground stations 106-108 can be generally configured for wireless communication of avionics data. For example, the aircraft 102 can periodically transmit location information to the ground station 106 and/or ground station 108 through the satellite 104. Avionics data can include data relating to various parameters of the aircraft 102, such as altitude, velocity, fuel level, time, location, and electro-mechanical (e.g. engine) operation.

The aircraft 102 can use a transmitter, receiver, transceiver, and/or one or more antennas to wirelessly communicate avionics data. For example, the aircraft 102 can employ one or more antennas configured for wireless transmission at one or more frequencies or channels, such as HF, VHF, SATCOM, HFDL, etc. Similarly, the ground stations 106-108 and/or the satellite 104 can employ a transmitter, receiver, transceiver, and/or one or more antennas capable of wireless communication at one or more frequencies or channels, such as HF, VHF, SATCOM, HFDL, etc. In some embodiments, the aircraft 102 sends and receives avionics data to the ground station 108 through the satellite 104. This can be preferable when a distance between the aircraft 102 and the ground station 108 exceeds a limit, such as when the aircraft 102 crosses an ocean.

Figure 2:
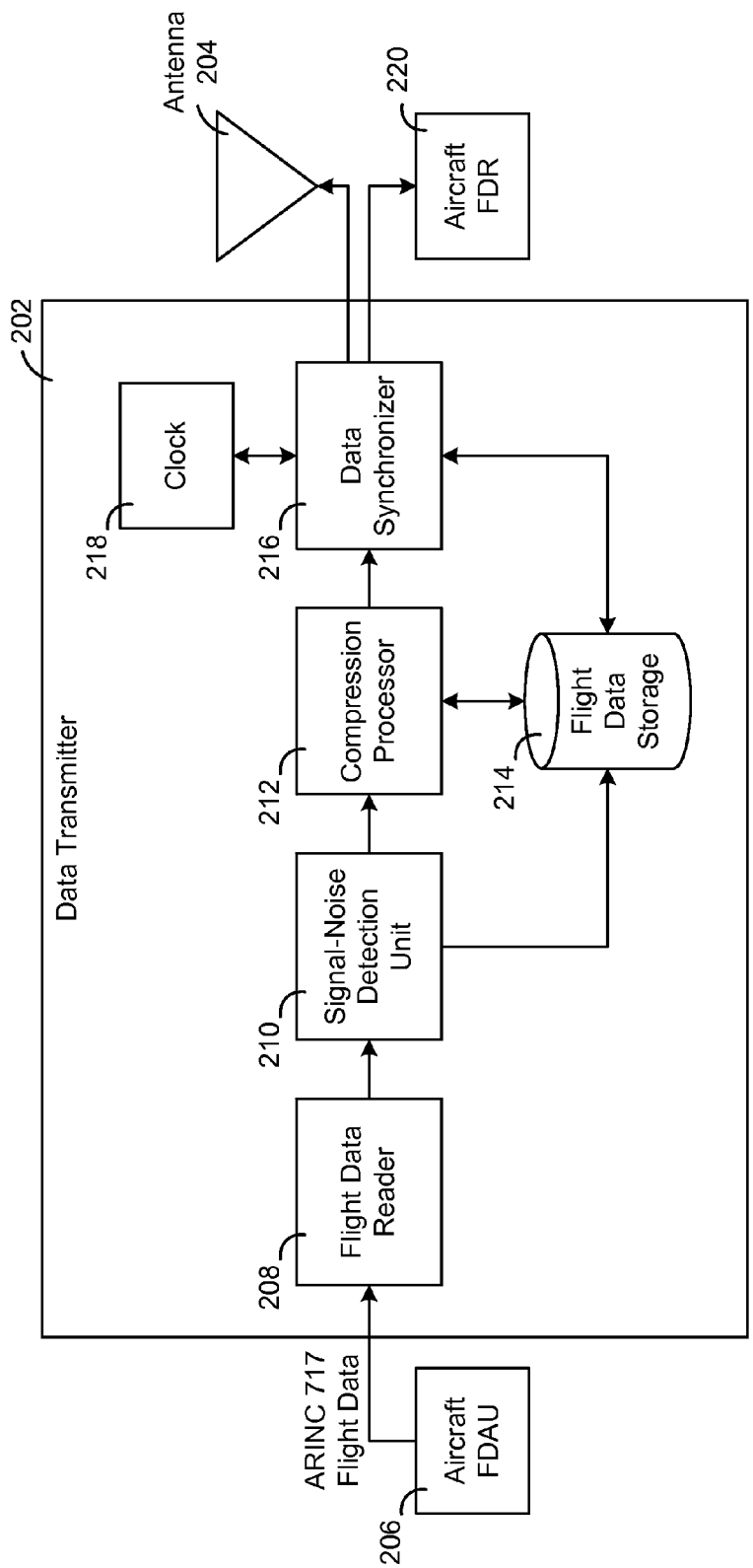
FIG. 2 is a block diagram of a transmitter device configured for streaming compression of periodic binary avionic data, according to inventive concepts in this disclosure.

Referring to FIG. 2, a data transmitter 202 is configured for streaming compression of periodic binary avionic data. The data transmitter 202 as referred to in this disclosure can be any device capable of unidirectional or bidirectional communication (e.g. transceiver). In an embodiment, the data transmitter 202 is installed in the aircraft 102. In an embodiment, the data transmitter 202 is capable of wireless communication with the satellite 104, the ground station receiver 106, and/or any device capable of wireless communication. Wireless communication can be accomplished via an antenna 204 communicably connected to the data transmitter 202. The antenna 204 can be internal to data transmitter 202 or provided as an external device. The data transmitter 202 can also be configured for wired communication, such as between the aircraft FDR 220.

The data transmitter 202 is shown to include a flight data reader 208, a signal-noise detection unit 210, a compression processor 212, a flight data storage 214, a data synchronizer 216, and a clock 218. Each of the above-mentioned elements, modules, engines, or entities (and others disclosed herein) is implemented in hardware, or a combination of hardware and software. For instance, each of these elements, modules, engines, or entities can include any application, program, library, script, task, service, process or any type and form of executable instructions executing on hardware of the system. The hardware includes circuitry such as one or more processors, memory devices, connections or bus structures, communication interfaces, and/or radio antennae in one or more embodiments.

In some embodiments, the flight data reader 208, the signal-noise detection unit 210, compression processor 212, the flight data storage 214, the data synchronizer 216, and/or the clock 218 can be provided separately from the data transmitter 202. For example, in some embodiments the flight data storage 214 is an external device communicably connected to the data transmitter 202 through a communication interface. As another example, the aircraft FDAU 206 and/or the aircraft FDR 220 can include the flight data reader 208, the signal-noise detection unit 210, the compression processor 212, the flight data storage 214, the data synchronizer 216, and/or the clock 218.

The flight data reader 208 is shown to receive ARINC 717 flight data input from the aircraft FDAU 206. Received data can relate to altitude, velocity, fuel level, time, location, electro-mechanical (e.g. engine) operation, and other parameters. In an embodiment, the aircraft FDAU 206 is a device configured to collect avionics data (digital and/or analog) relating to various parameters of an aircraft, convert the collected data to ARINC 717 format, and pass the converted data in ARINC 717 format to the data transmitter 202. The aircraft FDAU 206 can also transmit converted data in ARINC 717 format to the aircraft FDR 220 (not shown).

The signal-noise detection unit 210 is shown to receive ARINC 717 flight data from the flight data reader 208. In an embodiment, the signal-noise detection unit 210 is generally configured to detect and eliminate certain signal noise and/or other influences that have undesirably affected data parameter values. For example, the noise associated with an altitude signal of an aircraft in stable cruise flight with autopilot engaged can cause ARINC 717 flight data to erroneously indicate +/−50 feet of altitude change, even though actual altitude change is within +/−30 feet. The signal-noise detection 210 unit can be additionally or alternatively configured to manipulate flight data (even if correct) to minimize insignificant fluctuations, such as through hysteresis or other processing. For example, although ARINC 717 flight data associated with the altitude signal correctly shows +/−40 feet of altitude change over a period of time, it can be desirable to only include instances of at least +/−30 feet of altitude change. Thus, for example, instances of +/−10 feet of altitude change would be deemed insignificant and not included.

In some embodiments, the signal-noise detection unit 210 is not provided. For example, in some embodiments the data transmitter 202 is configured to provide streaming compression of periodic binary avionic data to the aircraft FDR 220. However, federal law or regulations may prohibit flight data to be stored in a flight data recorder from being altered by signal-noise reduction techniques. In this regard, the data transmitter 202 can be configured to not include the signal-noise detection unit 210.

In an embodiment, the signal-noise detection unit 210 first detects deviation of a current parameter value corresponding to a particular data parameter from a running average value corresponding to the same data parameter. In an embodiment, the signal-noise detection unit 210 uses the following algorithm to calculate a running average value (A):

$$A=(X+X_{-1}+X_{-2}+X_{-3})/4$$

where X is the current parameter value of a data parameter, and $X_{-1}$, $X_{-2}$, $X_{-3}$ are previous parameter values of the same data parameter. Although the above algorithm example calculates a running average value (A) using three previous parameter values, embodiments can calculate a running average value (A) using more or fewer previous parameters values.

Deviation (D) is calculated according to the equation:

$$D=|X-A|$$

Deviation value (D) can be compared to a predetermined deviation threshold (N). In an embodiment, signal-noise detection unit 210 stores a predetermined threshold value (N) for each data parameter (e.g. altitude, temperature, time) in a data loadable table or an Aircraft Personality Module (APM) and read at runtime by flight software.

If deviation value (D) is greater than deviation threshold value (N), then current parameter value (X) is determined to be significant and is recorded. In contrast, if deviation value (D) is not greater than deviation threshold value (N), then current parameter value (X) is set to a value corresponding to a previous parameter value, such as $X_{-1}$. For example, if expected noise associated with altitude change is +/−15 feet, deviation threshold value (N) can be set to a value of 15. Deviation value (D) is compared to a deviation threshold value (N) of 15. If deviation value (D) is greater than 15, then current parameter value (X) is determined to be significant and is recorded. In contrast, if deviation value (D) is not greater than the threshold value (N) of 15, then current parameter value (X) is set to a value corresponding to $X_{-1}$.

The signal-noise detection unit 210 subsequently passes ARINC 717 flight data with data parameter values, such as current parameter value (X), to the compression processor 212 and/or the flight data storage 214. In an embodiment, the signal-noise detection unit 210 is not provided. In this situation, the flight data reader 208 can be configured to directly pass ARINC 717 flight data to the compression processor 212 and/or the flight data storage 214.

Still referring to FIG. 2, the data transmitter 202 is shown to include the compression processor 212. The compression processor 212 can receive data from the signal-noise detection unit 210 and/or the flight data storage 214. In an embodiment, the compression processor 212 is generally configured to perform compression of ARINC 717 data, and pass compressed data for subsequent transmission.

The compression processor 212 can receive ARINC 717 words from the signal-noise detection unit 210 and/or the flight data storage 214. In an embodiment, the compression processor 212 compares each 12-bit word of a current frame to a corresponding word of the previously computed frame to identify a string of consecutive changed words or consecutive unchanged words. In an embodiment, the compression processor 212 initiates a counter to count a number of consecutive changed words or to count a number of consecutive unchanged words.

In an embodiment, when the compression processor 212 identifies a block containing consecutive unchanged words, the block of consecutive unchanged words is replaced by an 8-bit "skip" header that specifies the number of consecutive unchanged words (i.e. words removed). When the compression processor 212 identifies a block of changed words, the compression processor 212 can an 8-bit "read" header that specifies the number of words in the block. Transmission of the 8-bit read header can precede transmission the changed words. In an embodiment, each sync word (the first word of an ARINC 717 subframe) is always transmitted, even though it remains unchanged in relation to the previously computed frame. Embodiments can use headers corresponding to more or fewer bits, such as a 10-bit header or a 6-bit header.

In an embodiment, the 8-bit skip header can be distinguished from the 8-bit read header using the least significant bit of the header. For example, if the least significant bit corresponds to a value of "0", the header can be defined as a skip header. If the least significant bit corresponds to a value of "1", the header can be defined as a read header. The remaining seven bits of the 8-bit header can be used to identify a number of words in a corresponding block of consecutive changed words or consecutive unchanged words.

In an embodiment, a minimum block size is two words and a maximum block size is two-hundred and fifty-four words. Accordingly, for example, when a block of one changed word and one unchanged word is identified, the compression processor 212 inserts an 8-bit "read" header that specifies the number of words in the block. In an embodiment, the 8-bit read header precedes transmission the changed word and unchanged word. Embodiments can use any combination of minimum and maximum block sizes.

The flight data storage 214 is generally capable of storing flight data. The flight data storage 214 can be random access memory (RAM), read-only memory (ROM), hard drive storage, temporary storage, non-volatile memory, flash memory, optical memory, or any other suitable memory for storing data. In an embodiment, the flight data storage 214 is configured to receive and store ARINC 717 data for subsequent retrieval. For example, the compression processor 212 can compare a data parameter value corresponding to a current frame with a data parameter value corresponding to one or more previous data frames. In this regard, the compression processor 212 can call the flight data storage 214 to selectively retrieve one or more data parameter values and pass the retrieved data values back to compression processor 212. In some embodiments, flight data storage 214 can permanently store data (e.g. until manually deleted), and/or remove data according to a condition, such as expiration of a timer.

Still referring to FIG. 2, the data transmitter 202 is shown to include the data synchronizer 216. The data synchronizer 216 is generally configured to enable periodic transmission of uncompressed data. Embodiments of the compression process described herein rely on previously transmitted data to interpret current data. This can create a risk of data loss, and loss of a small amount of data can impact the ability to read future data. Furthermore, while data loss can be detected using sync words and frame counters, correction of affected data can have limitations. For example, correction of affected data can depend on receiving uncompressed data at a later time. A receiver attempting to begin reception during the middle of a transmission may not be able to compute the value of a parameter until it has been received in its uncompressed state.

To enable timely correction of lost data, uncompressed data can be periodically transmitted with compressed data. The data synchronizer 216 can use any suitable method of data synchronization. In some embodiments, the data synchronizer 216 receives a time input from the clock 218 to facilitate transmission of uncompressed data according to a repeating time period. For example, the data synchronizer 216 can be configured to transmit a full frame of uncompressed data every ten minutes. The data synchronizer 216 can also use the clock 218 to set timers corresponding to one or more words, and transmit the one or more words in uncompressed when a corresponding timer expires. In an embodiment, the method and period of data synchronization are determined by the data synchronizer 216.

In an embodiment, the data synchronizer 216 is configured to send a set number of uncompressed words from each subframe on every transmission. For example, sending eight words uncompressed every second can result in a full data refresh every 2 minutes. The data synchronizer 216 can set a transmission frequency of uncompressed data based on criticality of the application using the compression, risk of data loss, or any other factor. In an embodiment, the data synchronizer 216 is not provided and all data is transmitted in compressed form. In an embodiment, the data synchronizer 216 is configured to provide synchronized data, with compressed and uncompressed data, to the antenna 204 for wireless transmission and/or aircraft the FDR 220 for storage.

Still referring to FIG. 2, the antenna 204 can be any device suitable for wireless communication at any suitable channel or frequency, such as HF, VHF, SATCOM, HFDL, etc. In an embodiment, the aircraft FDR 220 is a flight data recorder capable of receiving and storing ARINC 717 data. The aircraft FDR 220 can receive ARINC 717 data directly from aircraft FDAU 206 (not shown). In an embodiment, the aircraft FDR 220 includes the flight data reader 208, the signal-noise detection unit 210, the compression processor 212, the flight data storage 214, the data synchronizer 216, and/or the clock 218. In this regard, the FDR 220 can be configured to perform various functions described above with respect to the data transmitter 202. For example, the aircraft FDR 220 can receive uncompressed ARINC 717 data directly from the aircraft FDAU 206, perform a compression process, and store compressed data. Compressed data can be stored in integral data storage or an external memory.

Figure 3A:
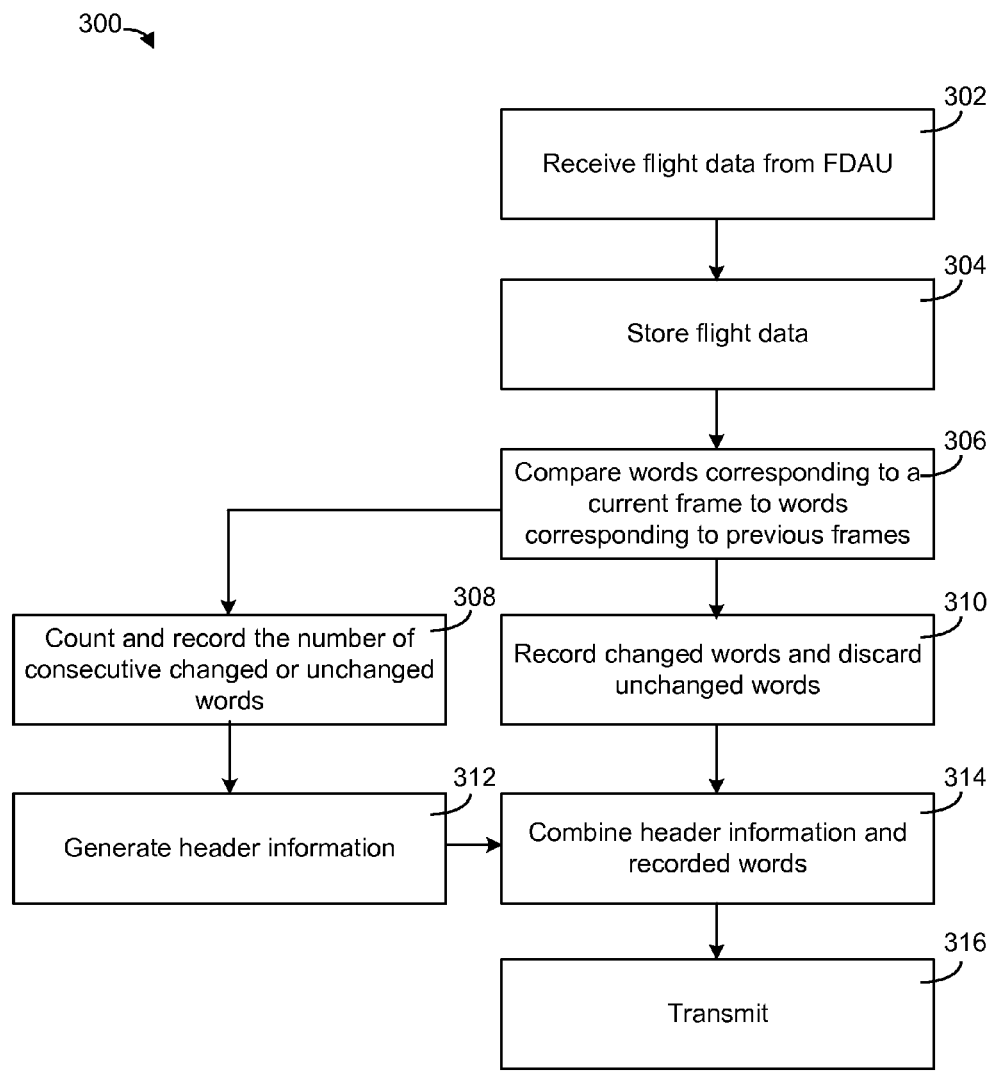
FIG. 3A is a flowchart of a process for streaming compression of periodic binary avionic data, according to inventive concepts in this disclosure.
Figure 3B:
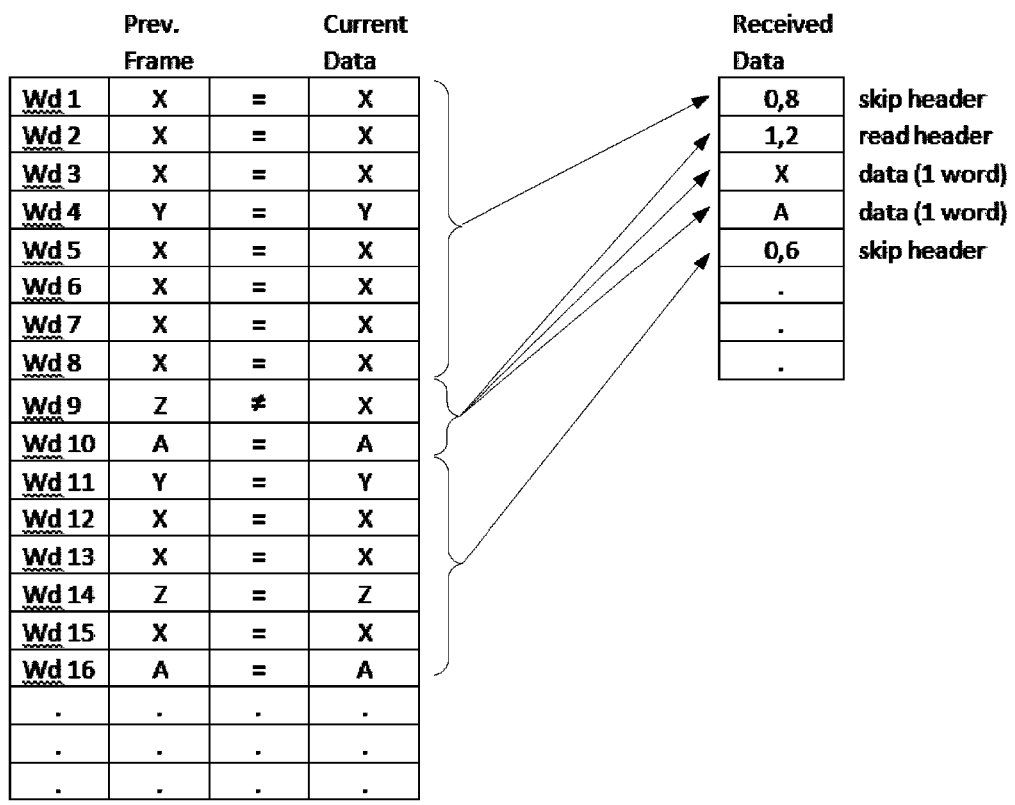
FIG. 3B is a diagram showing data organization of an example word sequence when compressed, according to inventive concepts in this disclosure.

Referring to FIG. 3A an embodiment of a method 300 performing a streaming compression process is shown. FIG. 3B is a diagram showing data organization of an example word sequence when compressed using the method 300. The method 300 can be performed by a data transmitter (e.g. the data transmitter 202) or data transceiver of an aircraft for wireless transmission to a ground station or satellite. In some embodiments, one or more steps of the method 300 are performed by a device with one or more processors and a memory. In some embodiments, one or more steps of the method 300 are performed by an aircraft FDR (e.g. the aircraft FDR 220). In this regard, the aircraft FDR can store the results of the streaming compression process.

Referring to step 302, and in some embodiments, the data transmitter 202, receives flight data from an aircraft FDAU, such as the aircraft FDAU 206. In an embodiment, received flight data is in an ARINC 717 format. Received data can relate to altitude, velocity, fuel level, time, location, electromechanical (e.g. engine) operation, and other parameters. Aircraft FDAU is a device that can be configured to collect data (digital and/or analog) relating to various parameters of an aircraft, convert the data to ARINC 717 format, and pass the converted data in ARINC 717 format.

At step 304, and in some embodiments, the data transmitter 202, stores flight data. In an embodiment, flight data is stored in ARINC 717 format and can be selectively retrieved. For example, subsequent data processing can involve comparison of a current data value to one or more previous data values. In this regard, stored data can be selectively called upon and passed for data processing. In some embodiments, data is permanently stored (e.g. until manually deleted) and/or deleted according to a condition (such as expiration of a time counter).

At step 306, and in some embodiments, the data transmitter 202, compares words corresponding to a current frame to words corresponding to previous frames. Compared words can be received from the aircraft FDAU 206 and/or the flight data storage 214. In an embodiment, the data transmitter 202 compares each 12-bit word of a current frame to a corresponding word of the previously computed frame to identify a string of consecutive changed words or unchanged words.

At step 308, and in some embodiments, the data transmitter 202, initiates a counter to count a number of consecutive changed words or to count a number of consecutive unchanged words. In an embodiment, the counter is generally configured to identify the total number of changed or unchanged words corresponding to a data block.

At step 310, and in some embodiments, the data transmitter 202, records changed words and discards unchanged words while counting the number of consecutive changed or unchanged words at step 208. In an embodiment, the data transmitter 202 first identifies a block containing consecutive unchanged words or a block containing consecutive changed words. When a block of consecutive unchanged words is identified, the block of consecutive unchanged words is replaced with an 8-bit read header. In contrast, when a block of consecutive changed words is identified, the block of consecutive changed words are subsequently transmitted. When a block of one changed word and one unchanged word is identified, the block is subsequently transmitted.

At step 312, and in some embodiments, the data transmitter 202 generates header information corresponding to the number of words in a block. When a block containing consecutive unchanged words is identified, an 8-bit "skip" header is generated that specifies the number of consecutive unchanged words (i.e. words removed). When a block of changed words or a block of one changed word and one unchanged word is identified, an 8-bit "read" header is generated that specifies the number of words in the block.

In an embodiment, the 8-bit skip header can be distinguished from the 8-bit read header using the least significant bit of the header. For example, if the least significant bit corresponds to a value of "0", the header can be defined as a skip header. If the least significant bit corresponds to a value of "1", the header can be defined as a read header. The remaining seven bits in the 8-bit header can be used to identify a number of words in a corresponding block of consecutive changed words or consecutive unchanged words. In this regard, a minimum block size is two words and a maximum block size is two-hundred and fifty-four words. Other embodiments may use a header size corresponding to more or fewer than eight bits, and may use a larger maximum block size.

At step 314, and in some embodiments, the data transmitter 202, combines header information and recorded words. Consecutive unchanged words are replaced by the 8-bit skip header, and the 8-bit skip header is transmitted. For a block of changed words or a block of one changed word and one unchanged word, transmission of the 8-bit read header precedes transmission of the words.

At step 316, and in some embodiments, the data transmitter 202, transmits the compressed data. In an embodiment, compressed data are wirelessly transmitted using an antenna or any device suitable for wireless communication at any suitable channel or frequency, such as HF, VHF, SATCOM, HFDL, etc. In an embodiment, the compressed data are transmitted to a data storage with recordable memory. For example, the compressed data can be transmitted to and received by the aircraft FDR 220 for subsequent retrieval.

Figure 4A:
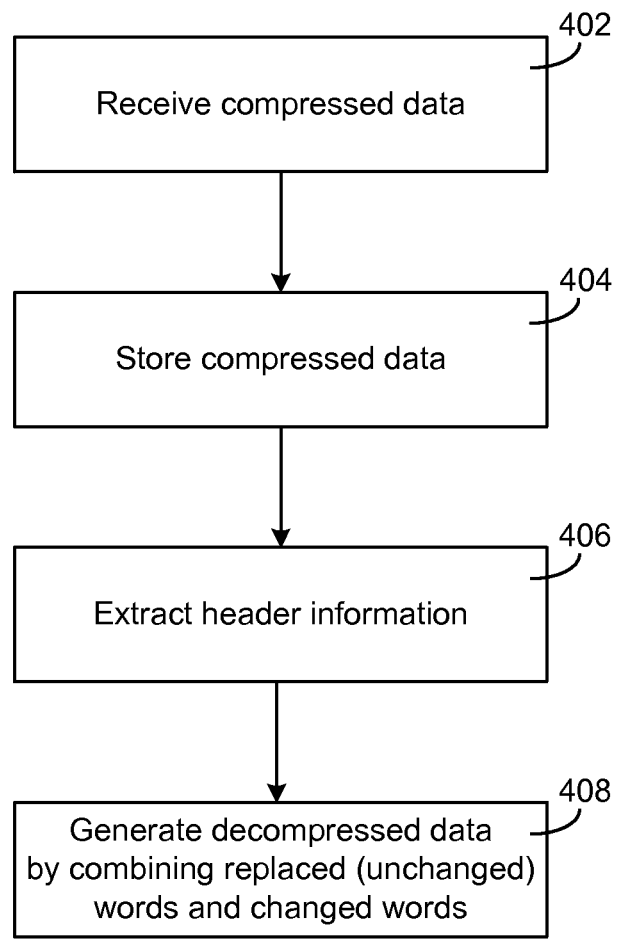
FIG. 4A is a flowchart of a process for decompression of periodic binary avionic data, according to inventive concepts in this disclosure.
Figure 4B:
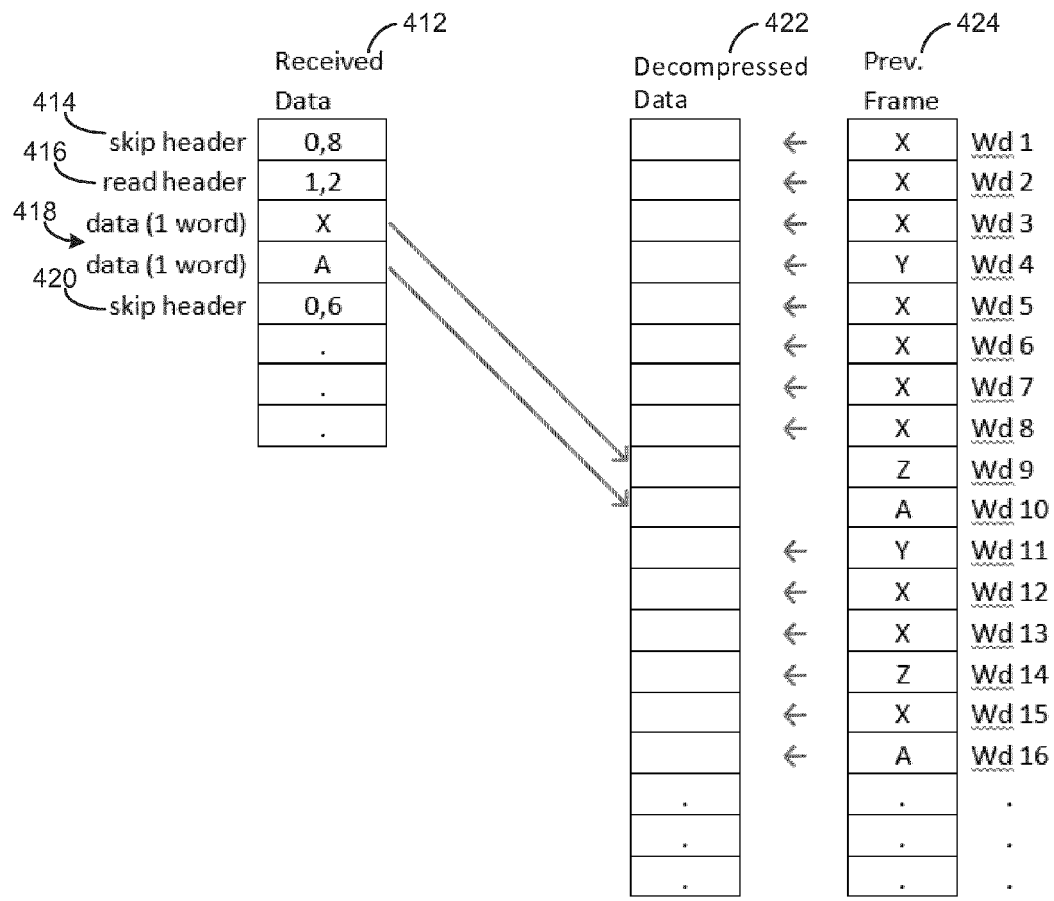
FIG. 4B is a diagram showing data organization of an example word sequence when decompressed, according to inventive concepts in this disclosure.

Referring to FIG. 4A an embodiment of a method 400 for performing decompression of the streaming compression process is shown. FIG. 4B is a diagram showing data organization of an example word sequence when decompressed using the method 400. The method 400 can be performed by a data receiver, a data transceiver, a ground station (e.g. the ground station 106), or any suitable device with an interface capable of receiving the compressed data. In some embodiments, one or more steps of the method 400 are performed by a device with one or more processors and a memory.

At step 402, compressed data are received. Compressed data can include avionics data relating to various parameters of the aircraft 102, such as altitude, velocity, fuel level, time, location, and electro-mechanical (e.g. engine) operation. In an embodiment, compressed data are received via wireless communication from the data transmitter 202 of an aircraft. Alternatively or additionally, compressed data are received via wired or wireless communication from a flight data recorder. Compressed data can be received by a ground station or any suitable device with an interface capable of receiving the compressed data, such as a data receiver or transceiver. Compressed data can be received wirelessly via an antenna configured for wireless communication at one or more frequencies or channels, such as HF, VHF, SATCOM, HFDL, etc.

At step 404 compressed data are stored. Compressed data can generally be stored in a device configured to selectively retrieve and transmit stored data. Data storage can include random access memory (RAM), read-only memory (ROM), hard drive storage, temporary storage, non-volatile memory, flash memory, optical memory, or any other suitable memory for storing data and/or computer instructions. In an embodiment, compressed data are stored in a device that receives compressed data at the step 402, such as a ground station 106 and/or the aircraft FDR 220. In an embodiment, compressed data are stored in a data storage containing both compressed and uncompressed data.

At step 406, header information is extracted. In an embodiment, a previous frame is referenced while processing compressed data of a current frame. When a sync word is detected, the header associated with the sync word is read to obtain a bit offset to the next header. Each header contains the bit offset to the header following it.

At step 408, replaced (or unchanged) words are combined with changed words. Consecutive changed words can be indicated by an 8-bit "read" header and consecutive unchanged words can be designated by an 8-bit "skip" header. In an embodiment, the 8-bit skip header can be distinguished from the 8-bit read header using the least significant bit of the header. For example, if the least significant bit corresponds to a value of "0", the header can be defined as a skip header. If the least significant bit corresponds to a value of "1", the header can be defined as a read header. The remaining seven bits in the 8-bit header can be used to identify a number of words in a corresponding block of consecutive changed words or consecutive unchanged words. In this regard, a minimum block size is two words and a maximum block size is two-hundred and fifty-four words. Other embodiments may use a header size corresponding to more or fewer than eight bits, and may use a larger maximum block size.

In an embodiment, when an 8-bit skip header is detected, words from a previous frame corresponding to the replaced words are retrieved from stored data at step 404. In an embodiment, the 8-bit skip header is substituted by the retrieved unchanged words. When an 8-bit read header is detected, the consecutive changed words corresponding to the read header are used and recorded as received. In an embodiment, the consecutive changed words are retrieved from stored data at step 404.

Referring to FIG. 4B, a diagram illustrating data organization of the example word sequence in FIG. 3B when decompressed using the method 400. FIG. 4B is shown to include a sequence of received data 412, a sequence of decompressed data 422, and a sequence of previous-frame data 424. The received data 412 is shown to sequentially include an 8-bit skip header 414, an 8-bit read header 416, data words 418, and an 8-bit skip header 420.

Each of the 8-bit headers 414, 416, 420 is shown to include a binary value of "0" or "1" followed by a decimal value. The binary value corresponds to a least significant bit of each 8-bit header 414, 416, 420, whereby a binary value of "0" represents a skip header and a binary value of "1" generally represents a read header. The decimal value corresponds to a number of words, whereby the number of words is represented by the remaining seven bits in each of the 8-bit headers 414, 416, 420. (Decimal form is provided for illustration purposes.) In this regard, the decimal value corresponds to a number between two and two-hundred fifty-four.

The 8-bit skip header 414 is processed for sequential placement in the decompressed data 422. The skip header 414 is shown to have a value "0,8" whereby "0" corresponds to a binary value of a least significant bit and "8" corresponds to a number of words represented by the remaining seven bits in the 8-bit skip header 414. (The "8" of the skip header 414 is shown in decimal form for illustration purposes and can otherwise be represented in binary form as "0001000".) The skip header 414 references corresponding words from the previous-frame data 424. In this regard, the skip header 414 with value "0,8" is placed in the decompressed data 422 by extracting the first eight words of the previous-frame data 424 and sequentially placing those words in the decompressed data 422.

Next, the 8-bit read header 416 is processed for sequential placement in the decompressed data 422. The read header 416 is shown to have a value "1,2" whereby the "1" corresponds to a least significant bit value and the "2" corresponds to a number of words represented by the remaining seven bits in the read header 416. (The "2" of the read header 416 is shown in decimal form for illustration purposes and can otherwise be represented in binary form as "0000010".) The read header 416 is processed to decompressed data 422 by extracting the two data words 418 from the received data 412. The two data words 418 are sequentially placed in the decompressed data 422. Decompression of the received data 412 continues (e.g. skip header 420) until all of the received data 412 are processed for sequential placement in the decompressed data 422.

Embodiments of the streaming compression of periodic binary avionic data can provide significant benefits. Currently, only the most basic information is infrequently transmitted from an aircraft for bandwidth limitation and cost reasons. Embodiments of the present disclosure can reduce a typical FDR stream to approximately 3% of its original size. This allows a full complement of FDR information to be transmitted from an aircraft to a ground station at low cost. For example, embodiments can allow full FDR data from a typical aircraft to be transmitted at data rates less than 400 bits/sec, which can be transmitted over satellite at reasonable costs and can be within reach of advanced HFDL systems. Compression can be tuned to meet requirements for data size, regulatory compliance, etc. Although compression can be lossless, individual parameters may be selected for lossy compression to save bandwidth. Because the amount of acceptable loss is tunable, it can be adjusted to align with signal noise levels.

Embodiments can also improve safety, because precise aircraft location information can be transmitted to the ground in real time. This allows rescuers and investigators to obtain an aircraft's location and the equivalent of its black box data recording before the aircraft is even located. Precise aircraft location information is important for timely arrival of rescue personnel, and a second source of flight data are useful if onboard recorders are lost or destroyed.

Embodiments of the compression of periodic binary avionic data are not only applicable to streaming data, but also it can be applied to static data for file size reduction. Existing aircraft networks are already designed for full data transmission so compression of data to be sent to the FDR may not be necessary. Use of the disclosed embodiments by an FDR to compress already received data, however, can be shown to be lossless and would allow an FDR to record significantly longer periods of aircraft data with less memory.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the inventive concepts disclosed herein. The order or sequence of any operational flow or method operations may be varied or re-sequenced according to alternative embodiments. Other substitutions, modifications, changes, and omissions may be made in the design, operating conditions and arrangement of the exemplary embodiments without departing from the broad scope of the inventive concepts disclosed herein.

The inventive concepts disclosed herein contemplate methods, systems and program products on any machine-readable media for accomplishing various operations. Embodiments of the inventive concepts disclosed herein may be implemented using existing computer operational flows, or by a special purpose computer operational flows for an appropriate system, incorporated for this or another purpose, or by a hardwired system. Embodiments within the scope of the inventive concepts disclosed herein include program products comprising machine-readable media for carrying or having machine-executable instructions or data structures stored thereon. Such machine-readable media can be any available media that can be accessed by a special purpose computer or other machine with an operational flow. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with an operational flow. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a special purpose computer, or special purpose operational flowing machines to perform a certain function or group of functions.

What is claimed is:

1. A method for streaming compression of flight data of an aircraft, the method comprising:
   receiving, by a data transmitter, flight data from a flight data acquisition unit;
   storing, by the data transmitter, the flight data; and
   compressing, by the data transmitter, the flight data into at least one word block;
   wherein the compressing the flight data into at least one word block comprises:
      comparing a set of words corresponding to a first data frame to a set of words corresponding to a second data frame, wherein the second data frame corresponds to a data frame previously received;
      identifying a word block of consecutive unchanged words, a word block of consecutive changed words, or a word block containing one changed word followed by one unchanged word;
      when a word block of consecutive unchanged words is identified, generating an 8-bit skip header identifying a number of words in the word block of consecutive unchanged words, and transmitting the 8-bit skip header;
      when a word block of consecutive changed words is identified, generating an 8-bit read header identifying a number of words in the word block of consecutive changed words, and transmitting the 8-bit read header and the word block; and
      when a word block contains one changed word followed by one unchanged word, generating an 8-bit read header identifying a number of words in the word block, transmitting the 8-bit read header and the word block;
      wherein each word block comprises at least 2 words and a maximum size of each word block is 254 words.

2. The method of claim 1, wherein the flight data are ARINC (Aeronautical Radio, Incorporated) 717 data.

3. The method of claim 2 wherein uncompressed words are periodically transmitted with compressed word blocks according to a predetermined formula.

4. The method of claim 3 wherein the predetermined formula comprises transmitting an alternating set of eight words in uncompressed format over a time period of one second.

5. The method of claim 2 wherein a least significant bit of the 8-bit skip header uses a different value from a least significant bit of the 8-bit read header.

6. The method of claim 2 further comprising the following after the receiving step and before the storing step:
   calculating, by the data transmitter, an average parameter value, wherein the average parameter value is an average of parameter values corresponding to the first data frame and three previous data frames;
   calculating, by the data transmitter, a deviation value, wherein the deviation value is an absolute value of a difference between the parameter value corresponding to the first data frame and the average parameter value;
   comparing, by the data transmitter, the deviation value to a predetermined deviation threshold; and
   when the deviation value is less than the predetermined deviation threshold, replacing the parameter value corresponding to the first data frame with a parameter value corresponding to a previous data frame.

7. The method of claim 2 wherein the receiving, storing, and compressing steps are performed by an aircraft flight data recorder.

8. A data transmitter of an aircraft comprising:
   a communications interface configured to receive flight data containing one or more words from a flight data acquisition unit;
   a data storage device configured to store received flight data in a memory; and
   a compression processor configured to perform the following:
      compare a set of words corresponding to a first data frame to a set of words corresponding to a second data frame, wherein the second data frame corresponds to a data frame previously received;
      identify a word block of consecutive unchanged words, a word block of consecutive changed words, or a word block containing one changed word followed by one unchanged word;
      when a word block of consecutive unchanged words is identified, generate an 8-bit skip header identifying a number of words in the word block of consecutive unchanged words, and transmit the 8-bit skip header;
      when a word block of consecutive changed words is identified, generate an 8-bit read header identifying a number of words in the word block of consecutive changed words, and transmit the 8-bit read header and the word block; and
      when a word block contains one changed word followed by one unchanged word, generate an 8-bit read header identifying a number of words in the word block, and transmit the 8-bit read header and the word block;
      wherein each word block comprises at least 2 words and a maximum size of each word block is 254 words.

9. The data transmitter of claim 8, wherein the flight data are ARINC (Aeronautical Radio, Incorporated) 717 data.

10. The data transmitter of claim 9 wherein uncompressed words are periodically transmitted with compressed word blocks according to a predetermined formula.

11. The data transmitter of claim 10 wherein the predetermined formula comprises an alternating set of eight words in uncompressed format over a time period of one second.

12. The data transmitter of claim 10 wherein the predetermined formula comprises transmitting one frame of uncompressed data after a time period of ten minutes.

13. The data transmitter of claim 9 wherein a least significant bit of the 8-bit skip header uses a different value from a least significant bit of the 8-bit read header.

14. The data transmitter of claim 9 wherein the data transmitter is further configured to perform the following:
   calculate an average parameter value, wherein the average parameter value is an average of parameter values corresponding to the first data frame and three previous data frames;
   calculate a deviation value, wherein the deviation value is an absolute value of a difference between the parameter value corresponding to the first data frame and the average parameter value;
   compare the deviation value to a predetermined deviation threshold; and
   when the deviation value is less than the predetermined deviation threshold, replace the parameter value corresponding to the first data frame with a parameter value corresponding to a previous data frame.

15. A flight data recorder of an aircraft comprising:
a communications interface configured to receive flight data containing one or more words from a flight data acquisition unit;
a data storage device configured to store received flight data in a memory; and
a compression processor configured to perform the following:
   compare a set of words corresponding to a first data frame to a set of words corresponding to a second data frame, wherein the second data frame corresponds to a data frame previously received;
   identify a word block of consecutive unchanged words, a word block of consecutive changed words, or a word block containing one changed word followed by one unchanged word;
   when a word block of consecutive unchanged words is identified, generate an 8-bit skip header identifying a number of words in the word block of consecutive unchanged words, and transmit the 8-bit skip header;
   when a word block of consecutive changed words is identified, generate an 8-bit read header identifying a number of words in the word block of consecutive changed words, and transmit the 8-bit read header and the word block; and
   when a word block contains one changed word followed by one unchanged word, generate an 8-bit read header identifying a number of words in the word block, and transmit the 8-bit read header and the word block;
   wherein each word block comprises at least 2 words and a maximum size of each word block is 254 words.

16. The flight data recorder of claim 15, wherein the flight data are ARINC (Aeronautical Radio, Incorporated) 717 data.

17. The flight data recorder of claim 16, wherein uncompressed words are periodically transmitted with compressed word blocks according to a predetermined formula.

18. The flight data recorder of claim 17 wherein the predetermined formula comprises an alternating set of eight words in uncompressed format over a time period of one second.

19. The flight data recorder of claim 17 wherein the predetermined formula comprises one frame of uncompressed data over a time period of ten minutes.

20. The flight data recorder of claim 16 wherein a least significant bit of the 8-bit skip header uses a different value from a least significant bit of the 8-bit read header.

* * * * *